United States Patent
Booth et al.

(10) Patent No.: US 8,547,085 B2
(45) Date of Patent: Oct. 1, 2013

(54) PLASMA-FACING PROBE ARRANGEMENT INCLUDING VACUUM GAP FOR USE IN A PLASMA PROCESSING CHAMBER

(75) Inventors: Jean-Paul Booth, Essonne (FR); Douglas Keil, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 452 days.

(21) Appl. No.: 12/498,940

(22) Filed: Jul. 7, 2009

(65) Prior Publication Data

US 2010/0007337 A1 Jan. 14, 2010

Related U.S. Application Data

(60) Provisional application No. 61/078,745, filed on Jul. 7, 2008.

(51) Int. Cl.
*G01P 3/48* (2006.01)
*G01P 3/54* (2006.01)

(52) U.S. Cl.
USPC . 324/166; 324/464; 324/754.24; 315/111.21; 438/770; 438/771; 438/772; 438/773; 438/774; 438/775; 438/776; 438/777; 438/792; 438/788; 118/715; 118/722; 118/723 R; 118/723 E; 156/345.24; 156/345.25; 156/345.26; 156/345.27; 156/345.28; 156/345.43; 156/345.44; 156/345.45; 156/345.46; 156/345.47

(58) Field of Classification Search
USPC ........................ 324/464, 754.24; 315/111.21; 438/770–777, 792, 788; 156/345.24–345.28, 156/345.43–345.47; 118/715, 722, 723 R, 118/723 E See application file for complete search history.

(56) References Cited

U.S. PATENT DOCUMENTS

| 4,595,487 A | * | 6/1986 | Nunlist | .......................... 204/433 |
| 4,963,713 A | * | 10/1990 | Horiuchi et al. | ......... 219/121.43 |

(Continued)

FOREIGN PATENT DOCUMENTS

| JP | 07-037817 A | 2/1995 |
| JP | 2001-144071 A | 5/2001 |

(Continued)

OTHER PUBLICATIONS

"International Preliminary Report on Patentability", Issued in PCT Application No. PCT/US2009/048747; Mailing Date: Jan. 13, 2011.

(Continued)

*Primary Examiner* — Arleen M Vazquez
*Assistant Examiner* — Lamarr Brown
(74) *Attorney, Agent, or Firm* — IPSG, P.C. Intellectual Property Law

(57) ABSTRACT

An arrangement for measuring process parameters within a processing chamber is provided. The arrangement includes a probe arrangement disposed in an opening of an upper electrode. Probe arrangement includes a probe head, which includes a head portion and a flange portion. The arrangement also includes an o-ring disposed between the upper electrode and the flange portion. The arrangement further includes a spacer made of an electrically insulative material positioned between the head portion and the opening of the upper electrode to prevent the probe arrangement from touching the upper electrode. The spacer includes a disk portion configured for supporting an underside of the flange portion. The spacer also includes a hollow cylindrical portion configured to encircle the head portion. The spacer forms a right-angled path between the o-ring and an opening to the processing chamber to prevent direct line-of-sight path between the o-ring and the opening to the processing chamber.

4 Claims, 2 Drawing Sheets

(56) References Cited

U.S. PATENT DOCUMENTS

| | | | |
|---|---|---|---|
| 4,982,067 A * | 1/1991 | Marantz et al. | 219/121.47 |
| 5,009,738 A * | 4/1991 | Gruenwald et al. | 156/345.47 |
| 5,175,472 A | 12/1992 | Johnson, Jr. et al. | |
| 5,473,162 A | 12/1995 | Busch et al. | |
| 5,891,350 A * | 4/1999 | Shan et al. | 216/71 |
| 5,936,413 A * | 8/1999 | Booth et al. | 324/678 |
| 5,985,092 A * | 11/1999 | Chiu et al. | 156/345.25 |
| 5,989,349 A * | 11/1999 | Ke et al. | 118/728 |
| 6,024,831 A | 2/2000 | Hwang et al. | |
| 6,140,215 A * | 10/2000 | Foster et al. | 438/580 |
| 6,165,311 A * | 12/2000 | Collins et al. | 156/345.26 |
| 6,176,930 B1 * | 1/2001 | Koai et al. | 118/715 |
| 6,218,312 B1 * | 4/2001 | Collins et al. | 438/723 |
| 6,220,202 B1 * | 4/2001 | Foster et al. | 118/723 E |
| 6,291,072 B1 * | 9/2001 | Kimoto et al. | 428/422 |
| 6,344,084 B1 * | 2/2002 | Koinuma et al. | 117/201 |
| 6,347,749 B1 * | 2/2002 | Moore et al. | 239/1 |
| 6,440,260 B1 | 8/2002 | Denda et al. | |
| 6,447,691 B1 | 9/2002 | Denda et al. | |
| 6,513,452 B2 * | 2/2003 | Shan et al. | 118/723 E |
| 6,626,998 B1 * | 9/2003 | Dunham | 118/723 R |
| 6,833,710 B2 | 12/2004 | Benveniste | |
| 6,894,474 B2 * | 5/2005 | Cox et al. | 324/71.1 |
| 6,902,646 B2 | 6/2005 | Mahoney et al. | |
| 6,972,071 B1 * | 12/2005 | Tyler | 156/345.47 |
| 7,013,834 B2 * | 3/2006 | Tyler et al. | 118/723 E |
| 7,067,432 B2 | 6/2006 | Xu et al. | |
| 7,093,560 B2 * | 8/2006 | Tong et al. | 118/723 E |
| 7,334,477 B1 | 2/2008 | Pirkle | |
| 7,374,636 B2 * | 5/2008 | Horioka et al. | 156/345.46 |
| 7,413,672 B1 | 8/2008 | Keil et al. | |
| 7,479,207 B2 * | 1/2009 | Kimball et al. | 156/345.24 |
| 7,651,568 B2 * | 1/2010 | Ishizaka et al. | 118/715 |
| 7,691,243 B2 * | 4/2010 | Vukovic | 204/298.16 |
| 7,723,994 B2 * | 5/2010 | Kimball et al. | 324/464 |
| 7,867,355 B2 * | 1/2011 | Kimball et al. | 156/345.28 |
| 7,928,366 B2 * | 4/2011 | Bogart et al. | 250/288 |
| 7,994,794 B2 * | 8/2011 | Kimball et al. | 324/464 |
| 8,070,880 B2 * | 12/2011 | Marubayashi et al. | 118/719 |
| 8,333,166 B2 * | 12/2012 | Bolden et al. | 118/723 E |
| 8,382,939 B2 * | 2/2013 | Kutney et al. | 156/345.34 |
| 2001/0006095 A1 * | 7/2001 | Snijders et al. | 156/345 |
| 2001/0025691 A1 * | 10/2001 | Kanno et al. | 156/345 |
| 2002/0011213 A1 | 1/2002 | Ramiah et al. | |
| 2002/0024338 A1 * | 2/2002 | Saho et al. | 324/248 |
| 2002/0100555 A1 * | 8/2002 | Hao et al. | 156/345.33 |
| 2002/0139478 A1 | 10/2002 | Ma et al. | |
| 2003/0038114 A1 | 2/2003 | Howald | |
| 2003/0150560 A1 * | 8/2003 | Kinnard et al. | 156/345.33 |
| 2003/0168168 A1 * | 9/2003 | Liu et al. | 156/345.3 |
| 2003/0196755 A1 * | 10/2003 | Antolik | 156/345.1 |
| 2003/0196760 A1 * | 10/2003 | Tyler et al. | 156/345.47 |
| 2003/0205328 A1 * | 11/2003 | Kinnard et al. | 156/345.37 |
| 2003/0210510 A1 | 11/2003 | Hann et al. | |
| 2003/0221780 A1 * | 12/2003 | Lei et al. | 156/345.29 |
| 2004/0001006 A1 * | 1/2004 | MacPherson et al. | 340/693.6 |
| 2004/0004708 A1 | 1/2004 | Willis | |
| 2004/0028810 A1 * | 2/2004 | Grant et al. | 427/248.1 |
| 2004/0035364 A1 * | 2/2004 | Tomoyoshi et al. | 118/723 E |
| 2004/0050492 A1 * | 3/2004 | Tsuei et al. | 156/345.33 |
| 2004/0107906 A1 * | 6/2004 | Collins et al. | 118/723 I |
| 2004/0126492 A1 * | 7/2004 | Weaver et al. | 427/250 |
| 2004/0187780 A1 * | 9/2004 | Park et al. | 118/715 |
| 2005/0032253 A1 | 2/2005 | Hsu et al. | |
| 2005/0103439 A1 | 5/2005 | Goodman | |
| 2005/0211384 A1 * | 9/2005 | Hayashi | 156/345.47 |
| 2005/0212450 A1 | 9/2005 | Martinez et al. | |
| 2005/0229849 A1 * | 10/2005 | Silvetti et al. | 118/715 |
| 2006/0150913 A1 | 7/2006 | Wang et al. | |
| 2006/0213437 A1 * | 9/2006 | Ishizaka et al. | 118/715 |
| 2006/0213438 A1 * | 9/2006 | Ishizaka et al. | 118/715 |
| 2006/0216406 A1 * | 9/2006 | Hudson et al. | 427/8 |
| 2006/0288934 A1 * | 12/2006 | Takahashi et al. | 118/715 |
| 2007/0080138 A1 | 4/2007 | Hoffman et al. | |
| 2007/0113783 A1 * | 5/2007 | Lee et al. | 118/715 |
| 2007/0131168 A1 * | 6/2007 | Gomi et al. | 118/715 |
| 2007/0158026 A1 * | 7/2007 | Amikura | 156/345.34 |
| 2007/0162172 A1 | 7/2007 | Tanaka et al. | |
| 2007/0215285 A1 | 9/2007 | Kimball et al. | |
| 2008/0066861 A1 * | 3/2008 | Kimball et al. | 156/345.1 |
| 2009/0007642 A1 * | 1/2009 | Busby et al. | 73/61.44 |
| 2009/0133836 A1 * | 5/2009 | Kimball et al. | 156/345.28 |
| 2009/0277584 A1 * | 11/2009 | Hudson et al. | 156/345.25 |
| 2009/0322342 A1 * | 12/2009 | Keil et al. | 324/464 |
| 2010/0006417 A1 | 1/2010 | Booth et al. | |
| 2010/0007359 A1 | 1/2010 | Booth et al. | |
| 2010/0007362 A1 | 1/2010 | Booth et al. | |
| 2010/0008015 A1 | 1/2010 | Booth et al. | |
| 2010/0033195 A1 | 2/2010 | Booth et al. | |
| 2010/0229372 A1 * | 9/2010 | Kimball et al. | 29/592.1 |
| 2011/0024045 A1 * | 2/2011 | Keil et al. | 156/345.48 |
| 2011/0128017 A1 * | 6/2011 | Booth et al. | 324/658 |
| 2011/0224046 A1 * | 9/2011 | Chen | 482/8 |
| 2012/0247678 A1 * | 10/2012 | Takahashi et al. | 156/345.44 |
| 2012/0316834 A1 * | 12/2012 | Booth et al. | 702/183 |

FOREIGN PATENT DOCUMENTS

| | | |
|---|---|---|
| JP | 2008-016517 A | 1/2008 |
| KR | 10-0378187 B1 | 3/2003 |
| KR | 10-2004-0024720 A | 3/2004 |
| KR | 10-2007-0035346 A | 3/2007 |
| KR | 10-2008-0048310 A | 6/2008 |

OTHER PUBLICATIONS

"International Search Report", Issued in PCT Application No. PCT/US2009/048747; Mailing Date: Feb. 11, 2010.

"Written Opinion", Issued in PCT Application No. PCT/US2009/048747; Mailing Date: Feb. 11, 2010.

"Non Final Office Action", U.S. Appl. No. 12/477,007, Mailing Date: Aug. 23, 2011.

"Non Final Office Action", U.S. Appl. No. 12/498,939, Mailing Date: Oct. 20, 2011.

"International Search Report", Issued in PCT Application No. PCT/US2009/049757; Mailing Date: Feb. 23, 2010.

"Written Opinion", Issued in PCT Application No. PCT/US2009/049757: Mailing Date: Feb. 23, 2010.

"International Search Report", Issued in PCT Application No. PCT/US2009/049760: Mailing Date: Feb. 23, 2010.

"Written Opinion", Issued in PCT Application No. PCT/US2009/049760; Mailing Date: Feb. 23, 2010.

"International Search Report", Issued in PCT Application No. PCT/US2009/049762; Mailing Date: Feb. 24, 2010.

"Written Opinion", Issued in PCT Application No. PCT/US2009/049762; Mailing Date: Feb. 24, 2010.

"International Search Report", Issued in PCT Application No. PCT/US2009/049756: Mailing Date: Mar. 2, 2010.

"Written Opinion", Issued in PCT Application No. PCT/US2009/049756; Mailing Date: Mar. 2, 2010.

"International Search Report", Issued in PCT Application No. PCT/US2009/049761; Mailing Date: Feb. 24, 2010.

"Written Opinion", Issued in PCT Application No. PCT/US2009/049761; Mailing Date: Feb. 24 2010.

"International Search Report", Issued in PCT Application No. PCT/US2009/049759; Mailing Date: Feb. 3, 2010.

"Written Opinion", Issued in PCT Application No. PCT/US2009/049759; Mailing Date: Feb. 3, 2010.

"International Preliminary Report on Patentability", Issued in PCT Application No. PCT/US2009/049756; Mailing Date: Jan. 20, 2011.

"International Preliminary Report on Patentability", Issued in PCT Application No. PCT/US2009/049757; Mailing Date: Jan. 20, 2011.

"International Preliminary Report on Patentability", Issued in PCT Application No. PCT/US2009/049759; Mailing Date: Jan. 20, 2011.

"International Preliminary Report on Patentability", Issued in PCT Application No. PCT/US2009/049760; Mailing Date: Jan. 20, 2011.

"International Preliminary Report on Patentability", Issued in PCT Application No. PCT/US2009/049761; Mailing Date: Jan. 20, 2011.

"International Preliminary Report on Patentability", Issued in PCT Application No. PCT/US2009/049762; Mailing Date: Jan. 20, 2011.
"Notice of Allowance", U.S. Appl. No. 12/498,934, Mailing Date: Nov. 28, 2011.
"Final Office Action", U.S. Appl. No. 12/498,939, Mailing Date: Mar. 15, 2012.

"Non Final Office Action", U.S. Appl. No. 12/498,939, Mailing Date: Oct. 9, 2012.
"Final Office Action", U.S. Appl. No. 12/477,007, Mailing Date: Apr. 26, 2012.

* cited by examiner

US 8,547,085 B2

PLASMA-FACING PROBE ARRANGEMENT INCLUDING VACUUM GAP FOR USE IN A PLASMA PROCESSING CHAMBER

PRIORITY CLAIM

This application is related to and claims priority under 35 U.S.C. §119(e) to a commonly assigned provisional patent application entitled "Plasma-facing Probe Arrangement Including Vacuum Gap For Use In A Plasma Processing Chamber," by Booth et al., application Ser. No. 61/078,745, filed on Jul. 7, 2008, which is incorporated by reference herein.

BACKGROUND OF THE INVENTION

Plasma processing systems have long been employed to process substrates into finished electronic products for creating integrated circuits (ICs). Plasmas may be generated using a variety of plasma generation technologies, including for example inductively coupled plasma, capacitively coupled plasma, microwave, electron-cyclotron resonance (ECR), etc.

During the processing of a substrate, it is highly desirable to accurately and timely monitor various process parameters inside the plasma processing chamber. Plasma-facing probe or sensor techniques, which involve exposing a surface of the probe or sensor made of an electrically conductive material to the plasma, has long been employed for such monitoring tasks. One type of plasma-facing monitoring probe that has been employed to measure the process parameters is an ion flux probe, such as that described in U.S. Pat. No. 7,319,316, entitled "Apparatus For Measuring A Set Of Electrical Characteristics In A Plasma." In the aforementioned U.S. Pat. No. 7,319,316, a substantially co-planar probe is employed to measure the ion flux within the plasma processing chamber. The measured ion flux may then be employed for ascertaining, for example, the endpoint of a chamber conditioning process, for measuring plasma properties (e.g., ion saturation current, electron temperature, floating potential, etc.), for chamber matching (e.g., looking for differences between chambers which should nominally be identical), for detecting faults and problems in the chamber, etc.

Some production versions of the ion flux probe have been implemented in the field, and it has been discovered that opportunities for improvement are possible. To facilitate discussion, FIG. 1 shows a typical ion flux probe installation. In FIG. 1, ion flux probe 102 is disposed in an aperture 104 in an upper electrode of a plasma processing chamber. The upper electrode is typically formed of aluminum or graphite, with a plasma-facing surface 106 formed of a suitable material, such as silicon.

Ion flux probe 102 comprises a stem 110 for coupling with a support structure (of which a portion 112 is shown). Stem 110 is typically formed of an electrically and thermally conductive material, such as aluminum. An insulating ring 114 surrounds stem 110 as shown and is designed to provide centering support for stem 110 within aperture 104 as well as electrically insulate stem 110 from the rest of the upper electrode.

Ion flux probe 102 also includes a plasma-facing probe head 120, which is formed of a material that is designed to be chemically and electrically substantially similar to the plasma-facing surface 106 of the upper electrode in order to facilitate accurate measurement of parameters from the plasma (disposed below the upper electrode in the example of FIG. 1). In the case of FIG. 1, probe head 120 is formed of silicon as well. An O-ring 130 is provided to prevent contaminants from falling into the chamber through the gap 136 between ion flux probe 102 and aperture 104. Gap 136 exists due to mechanical tolerance and also to accommodate thermal expansion during the process cycles. O-ring 130 is typically formed of a resilient elastomer, and also functions to seal the process gas inside the chamber from escaping upward through the aforementioned gap.

A ring 132 is shown disposed around probe head 120. Ring 132 may be made of quartz (as in the case of the example of FIG. 1) or of another suitable dielectric material. Quartz ring 132 is designed to electrically insulate probe head 120 from the rest of the upper electrode. A secondary function of quartz ring 132 is to protect o-ring 130 from being unduly attacked by the higher energy ions and radicals of the plasma generated within the chamber.

However, it has been noted that there are opportunities for improvement in the design of the ion flux probe and in the mounting of the ion flux probe in the chamber. For example, the presence of quartz ring 132 has been found to create a chemical loading condition in the chamber during plasma processing since quartz ring 132 is a different material than the silicon material of the probe head 120 or the silicon material of the plasma-facing surface 106 of the upper electrode. During certain etch processes, such as during a dielectric etch, the etching of quartz ring 132 may change the chemical or plasma composition inside the chamber, leading to undesirable etch results on the substrate. Furthermore, as quartz ring 132 is consumed, a recess may be formed between the lower surface of the upper electrode and the plasma-facing surface of probe head 120 and may create a "polymer trap," potentially increasing the possibility of particulate contamination on the substrate during subsequent processing cycles. Furthermore, as quartz ring 132 is eroded, measurements by the ion flux probe may be distorted since the probe head geometry as presented to the plasma has changed.

As seen in FIG. 1, a direct line-of-sight exists between tile plasma (which is formed below the upper electrode of FIG. 1) and o-ring 130. This direct line-of-sight permits plasma constituent components, such as the high energy ions and radicals, to reach the o-ring, thereby contributing to an accelerated rate of o-ring degradation. The accelerated degradation of o-ring 130 necessitates a higher frequency of maintenance for the purpose of replacing o-ring 130, which leads to more system downtime, reduced plasma system throughput, and a higher cost of ownership for the plasma processing tool.

Another issue with the arrangement of FIG. 1 pertains to the lack of mechanical referencing between ion flux probe 102 and the rest of the upper electrode. Since ion flux probe 102 is coupled to a support structure 112 that is mechanically independent of the upper electrode, it has been found that the accurately positioning ion flux probe 102 during installation to ensure that the lower surface of probe head 120 is flushed with the lower surface 106 of the upper electrode has been a challenge.

Another aspect of the ion flux probe arrangement of FIG. 1 that may also be improved relates to thermal equilibrium. For accurate measurement, it is desirable that the ion flux probe, and in particular ion probe head 120, be at thermal equilibrium as quickly as possible with the rest of the upper electrode. However, since ion flux probe 102 of FIG. 1 is mechanical coupled to support structure 112 and only contacts the remainder of the upper electrode incidentally through insulating ring 114 and quartz ring 132 (both of which are relatively poor thermal conductors), the goal of achieving fast local thermal equilibrium between probe head 120 and the upper electrode has not always been satisfactorily attained.

BRIEF SUMMARY OF THE INVENTION

The invention relates, in an embodiment, to an arrangement for measuring process parameters within a processing chamber of a plasma processing system. The arrangement includes a probe arrangement disposed in an opening of an upper electrode, wherein the probe arrangement includes a probe head. The probe head includes a head portion, which is a cylindrical plug with a plasma-facing surface and is positioned within the opening of the upper electrode. The probe head includes a flange portion, which is a hollow cylindrical structure with a diameter larger than the head portion and is positioned above an upper surface of the upper electrode. The arrangement also includes an o-ring disposed between the upper surface of the upper electrode and a bottom-facing surface of the flange portion of the probe head. The arrangement further includes a spacer made of an electrically insulative material positioned between a vertical sidewall of the head portion of the probe head and a vertical sidewall of the opening of the upper electrode to prevent the probe arrangement from touching the upper electrode when the probe arrangement is inserted into the opening of the upper electrode. The spacer includes a disk portion configured at least for supporting an underside of the flange portion of the probe head. The spacer includes a hollow cylindrical portion configured to encircle the head portion of the probe head, which has a smaller diameter than the disk portion. The spacer forms a right-angled path between the o-ring and an opening to the processing chamber, thereby preventing a direct line-of-sight path between the o-ring and the opening to the processing chamber.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not necessarily obscure the present invention.

Figure 1:
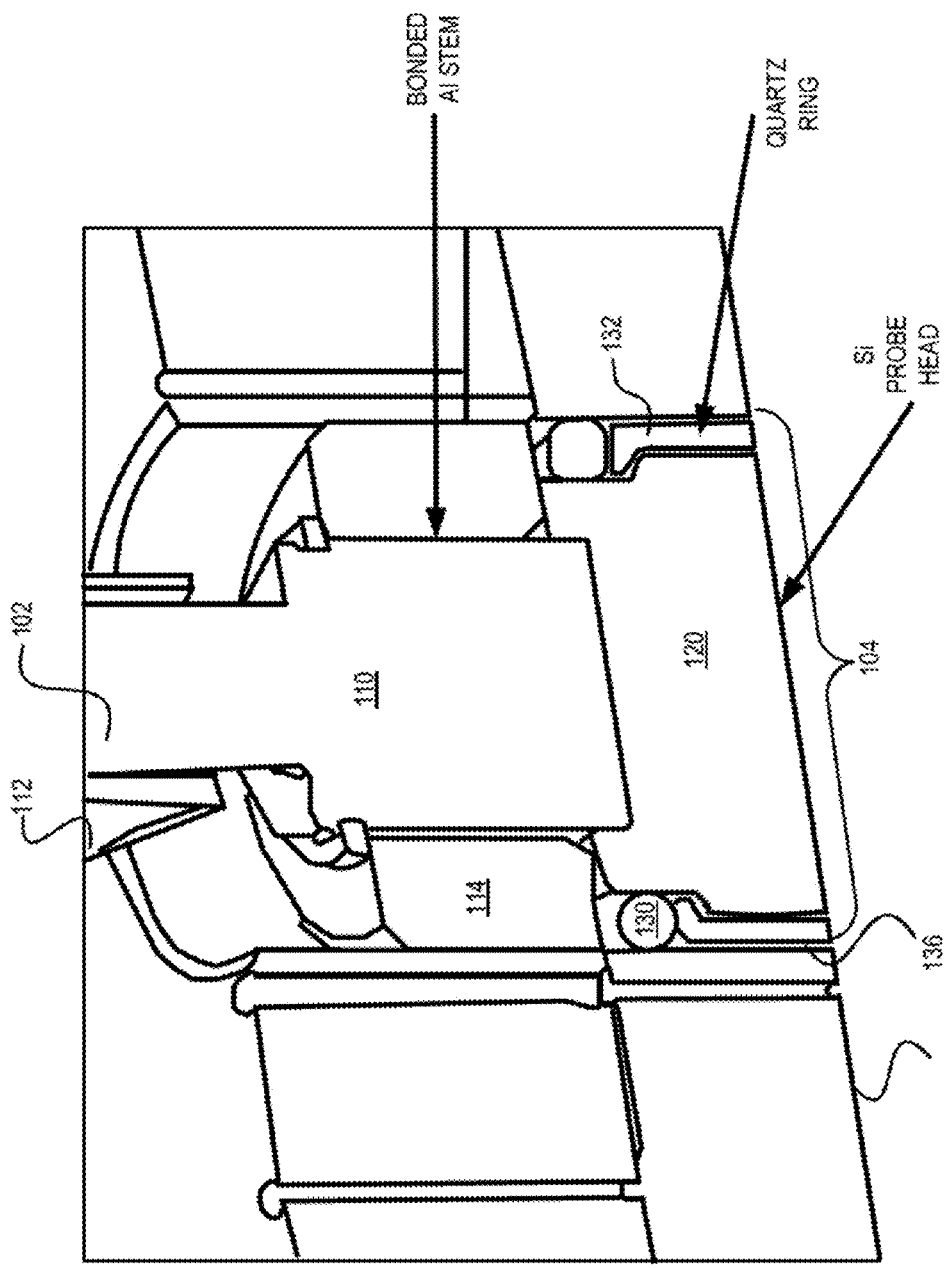
FIG. 1 shows a prior art ion flux probe arrangement.

Embodiments of the invention relate to an improved ion flux design in which the direct plasma exposure of the dielectric material of the insulating/spacer ring (such as the quartz material of quartz ring 132 of FIG. 1) has been eliminated. Further, innovative design changes, such as using a high aspect ratio vacuum gap and a sharply angled plasma-to-o-ring path, have been incorporated to lengthen the life of the o-ring. Additionally, in one or more embodiments, the improved design mechanically references the ion flux to the upper electrode, thereby rendering it possible to accurately position the ion flux probe such that the plasma-facing probe head surface may be flushed with the plasma-facing surface of the upper electrode. Innovative design changes have also improved the thermal conductivity between the ion flux probe and the surrounding upper electrode material, rendering it possible to more quickly achieve local thermal equilibrium between the ion flux probe and the upper electrode.

Figure 2:
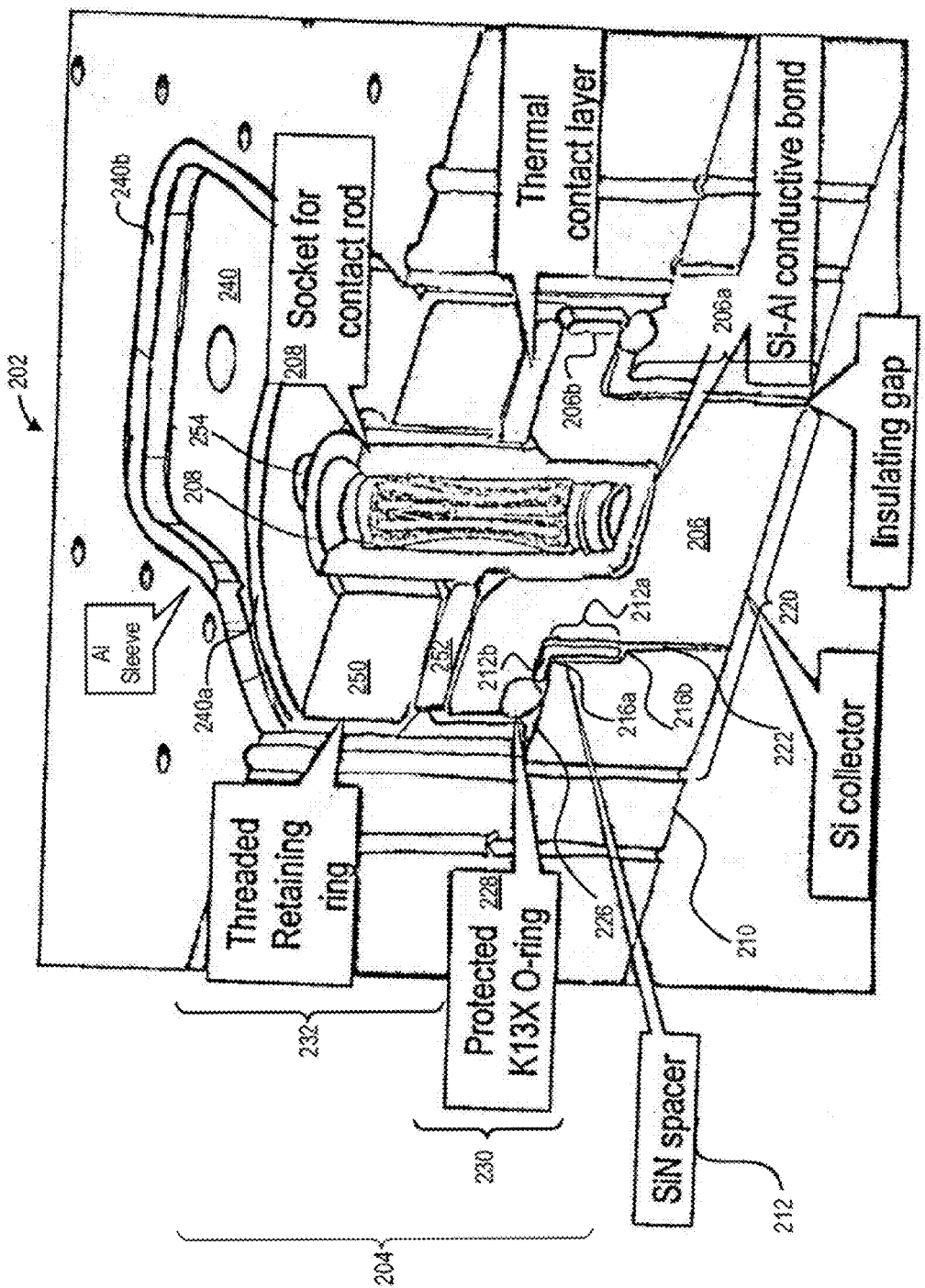
FIG. 2 shows, in accordance with an embodiment of the invention, an improved ion flux probe arrangement.

The features and advantages of embodiments of the invention may be better understood with reference to the figures and discussions that follow. FIG. 2 shows, in accordance with one or more embodiments of the invention, an improved ion flux probe 202 disposed in an upper electrode 204. Ion flux probe 202 includes a probe head 206, which is in electrical contact with a socket 208. Probe head 206 is formed of the same material as the plasma-facing surface of upper electrode 204, which is silicon in an embodiment.

Alternatively, probe head 206 may be formed of a different material that allows ion flux measurement to be made accurately while minimizing adverse impact on the plasma process. Socket 208 is made of an electrically conductive material and is electrically coupled to probe head 206 via a conductive solder or bond, such as a solder comprising tin/silver for example if socket 208 is formed of aluminum and probe head 206 is formed of silicon. A contact rod (not shown) may be inserted into socket 208 to receive and relay measurements obtained via probe head 206.

Probe head 206 has a head portion 206a and a flange portion 206b. Head portion 206a is a cylindrical plug that is configured to have a plasma-facing surface 206c that is flush with the plasma-facing surface 210 of the upper electrode 204. Flange portion 206b is, in an embodiment, a hollow cylindrical structure that has a larger diameter than head portion 206a. A spacer 212 is provided and is formed, in an embodiment, of a hollow cylindrical portion 212a integrated with a disk portion 212b. Spacer 212 is formed of SiN in an embodiment for dielectric etch applications due to the compatibility of the SiN material with dielectric etching. However, any rigid material that is electrically insulative and compatible with the contemplated plasma process may be employed for spacer 212.

Hollow cylindrical portion 212a is configured to encircle head portion 206a of probe head 206 while disk portion 212b is configured to support the underside of flange portion 206b of probe head 206. Two shoulders 216a and 216b are built into upper electrode 204 to accommodate hollow cylindrical portion 212a and disk portion 212b. When spacer 212 is disposed within opening 220 and probe head 206 is also disposed in opening 220, hollow cylindrical portion 212a is sandwiched between the vertical sidewall of head portion 206a and the sidewall of opening 220 as shown. Further, disk portion 212b is sandwiched between the lower side of flange portion 206b and the upper surface 226 formed out of upper electrode 204. By sandwiching spacer 212 in the manner discussed, spacer 212 serves to accurately position probe head 206 within opening 220 such that a small gap 222 is created between the vertical sidewall of probe head 206 and the vertical sidewall of opening 220 in the surrounding material of upper electrode 204. The accurate position of probe head 206 within opening 220 is important to prevent an inadvertent electrical short between probe head 206 and the surrounding material of upper electrode 204.

An o-ring 228 is sandwiched between upper surface 226 and the lower surface of flange portion 206b as shown in FIG. 2. Further, o-ring 228 is disposed outside of flange portion 206b. O-ring 228 prevents contaminants from reaching the chamber interior (below upper electrode 204 in the example of FIG. 2) and also helps prevent uncontrolled chamber gases ingress or egress, thereby improving process stability.

Gap 222 is a high aspect ratio gap (i.e., much longer than wide) that is designed to be incapable of supporting plasma in the gap. The high aspect ratio gap also presents a large surface area in the gap such that any radicals penetrating gap 222 will likely be recombined and/or neutralized along the gap walls prior to reaching o-ring 228. The right-angled turn in the plasma-to-o-ring path created by spacer 212 also helps to reduce the number of high energy ions from reaching o-ring 228 since these high energy ions may impinge upon the corner of the right-angled turn and become neutralized before reaching o-ring 228.

In this manner, the improved design avoids the direct line-of-sight path between the plasma and the o-ring, thereby contributing to a longer life for the o-ring. Additionally, no quartz ring needs to be present to the plasma, thus obviating the disadvantages associated with the prior art arrangement (such as the unwanted presence of the quartz material in the plasma environment, the chemical loading that exists due to the unintended etching of the quartz material, and the etching of the quartz material itself which may occur at a different rate than the etching of the probe head and the surrounding plasma-facing upper electrode material). Instead, gap 222 serves as an insulating gap "ring" to electrically insulate head portion 206a of probe head 206 from the surrounding upper electrode material of opening 220.

In the example of FIG. 2, upper electrode 204 is formed of one or more upper layers bonded to the plasma-facing layer. The plasma-facing layer 230 is silicon in the example of FIG. 2, as mentioned, to present a compatible material for etch processes such as dielectric etching. The upper layer may be formed of an electrically and thermally conductive material such as aluminum or graphite. In the example of FIG. 2, upper layer 232 is graphite. To provide structural support for probe 202, a sleeve 240 is formed in upper electrode 204. In the example of FIG. 2, sleeve 240 is formed of aluminum although other structurally suitable material such as stainless steel may also be employed. Sleeve 240 may be bonded to the graphite material of the upper electrode, in an embodiment.

Aluminum sleeve 240 includes an internally threaded portion 240a and an ear portion 240b. Internally threaded portion 240a has internal threads to accommodate a threaded retainer ring 250, which may be made of a material such as aluminum or stainless steel. A thermal contact ring 252 is disposed between the upper surface of flange portion 206b of probe head 206 and the lower surface of threaded retainer ring 250. Thermal contact ring 252 may be formed of a suitable material, such as silicon polymer or alumina for example, to facilitate thermal conduction between probe head 206 and threaded retainer ring 250 while providing an electrically insulative function between probe head 206 and threaded retainer ring 250.

When threaded retainer ring 250 is mated with the internal threads of threaded portion 240a of aluminum sleeve 240 and is screwed down (via tooling hole 254), threaded retainer ring 250 functions as a thrust ring and forces flange portion 206b downward against upper surface 226 to rigidly capture flange portion 206b and to fix probe head 206 within opening 220. In this manner, probe head 206 is positively referenced in the vertical direction with respect to upper electrode 204, thereby allowing more accurate positioning of probe head 206 relative to upper electrode 204 to achieve the desired flushed surface between the plasma-facing surface of probe head 206 and plasma-facing surface 210 of upper electrode 204. The compressive force provided by threaded retainer 250 also compresses o-ring 228, thereby improving sealing. Threaded retainer ring 250 preferably has an inner thru-hole that has a larger diameter than the diameter of socket 208. In this manner, there is no electrical conduction path between socket 208 and threaded retainer ring 250.

Ear portion 240b structurally resists the rotational torque that may be imposed on sleeve 240 when threaded retainer ring 250 is screwed down. Ear portion 240b (of which there may be one or many) also presents a large thermal contact area between sleeve 240 and the remaining graphite material of the upper electrode. Thermally speaking, there is an efficient thermal conduction path between probe head 206 to the upper electrode material surrounding aluminum sleeve 240 via thermal contact ring 252, threaded retainer ring 250, and aluminum sleeve 240. In this manner and unlike the prior art arrangement of FIG. 1, probe head 206 may more readily achieve thermal equilibrium with the remainder of upper electrode 204, thereby enabling measurements to be made more accurately and/or more timely without having to wait for a lengthy thermal stabilization period.

Note that if upper layer 232 of upper electrode 204 is formed of a material (such as aluminum or stainless steel) that can structurally form threads to accommodate the threads of threaded retainer ring 250, sleeve 240 may be eliminated. In this case, threads can be created directly in the material of upper electrode 204. Also, socket 208 is provided for convenience and may be eliminated in an embodiment. If socket 208 is eliminated, a contact rod may be bonded directly to probe head 206 if desired.

While this invention has been described in terms of several preferred embodiments, there are alterations, permutations, and equivalents, which fall within the scope of this invention. For example, although an ion flux probe is employed to illustrate the innovative structures for positioning and installing the probe, the innovative mechanical structures and arrangements herein may be employed to accurately position and to mount any plasma-facing sensor on any chamber surface (which includes but is not limited to the upper electrode) in order to facilitate the measurement of one or more parameters during plasma processing. Examples of such sensors include, without limitation. self-exited electron resonance spectroscopy (SEERS), Langmuir probes or variants thereof. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

What is claimed is:

1. An arrangement for measuring process parameters within a processing chamber of a plasma processing system, comprising:
   a probe arrangement disposed in an opening of an upper electrode, wherein said probe arrangement includes a probe head and said probe head includes
   a head portion, wherein said head portion is a cylindrical plug with a plasma-facing surface and is positioned within said opening of said upper electrode; and
   a flange portion, wherein said flange portion is as hollow cylindrical structure with a diameter larger than said head portion and is positioned above an upper surface of said upper electrode;
   an o-ring disposed between said upper surface of said upper electrode and a bottom-facing surface of said flange portion of said probe head; and
   a spacer made of an electrically insulative material positioned between a vertical sidewall of said head portion of said probe head and a vertical sidewall of said opening of said upper electrode to prevent said probe arrangement from touching said upper electrode when said probe arrangement is inserted into said opening of said upper electrode, wherein said spacer includes
   a disk portion configured at least for supporting an underside of said flange portion of said probe head, and
   a hollow cylindrical portion configured to encircle said head portion of said probe head, wherein said hollow cylindrical portion has a smaller diameter than said disk portion, wherein said spacer forms a right-angled path between said o-ring and an opening to said processing chamber, thereby preventing a direct line-of-sight path between said o-ring, and said opening to said processing chamber; said upper electrode is configured to include a plasma-facing layer, wherein said plasma-facing layer is made of silicon, and a set of upper layers, wherein said set of upper layers is bonded to said plasma-facing layer, said set of upper layers being made of an electrically and thermally conductive material;
   said upper electrode includes a sleeve, wherein said sleeve includes an internally threaded portion and an ear portion; said internally threaded portion is threadedly mated with a threaded retainer ring, thereby allowing compressing of said o-ring and forcing said flange portion of said probe head downward against said upper surface of said upper electrode in response to being screwed down.

2. The arrangement of claim 1 wherein said threaded retainer ring includes an inner thru-hole with a larger diameter than a diameter of a socket, wherein said socket is in electrical contact with said probe head.

3. The arrangement of claim 2 and further wherein a thermal contact ring is disposed between an upper-facing surface of said flange portion and a lower surface of said threaded retainer ring, wherein said thermal contact ring electrically insulates said probe head from said threaded retainer ring.

4. The arrangement of claim 2 wherein said thermal contact ring is made from a silicon polymer.

* * * * *